United States Patent [19]

Uranaka

[11] Patent Number: 5,304,866
[45] Date of Patent: Apr. 19, 1994

[54] SAMPLE-AND-HOLD CIRCUIT
[75] Inventor: Shinichi Uranaka, Tenri, Japan
[73] Assignee: Sharp Kabushiki Kaisha, Osaka, Japan
[21] Appl. No.: 868,213
[22] Filed: Apr. 14, 1992
[30] Foreign Application Priority Data
Apr. 15, 1991 [JP] Japan .................................. 3-082396
[51] Int. Cl.⁵ ...................... H03K 5/159; H03K 5/153
[52] U.S. Cl. ................................... 307/353; 307/494; 307/360; 307/362
[58] Field of Search ................. 307/353, 494, 360, 362

[56] References Cited

U.S. PATENT DOCUMENTS

| | | | |
|---|---|---|---|
| 4,475,087 | 10/1984 | Nagano | 330/288 |
| 4,797,581 | 1/1989 | Martiny | 307/475 |
| 5,162,670 | 11/1992 | Itakura et al. | 307/353 |

FOREIGN PATENT DOCUMENTS

| | | |
|---|---|---|
| 0369716 | 5/1990 | European Pat. Off. . |
| 2455517 | 6/1975 | Fed. Rep. of Germany . |
| 2718175 | 11/1978 | Fed. Rep. of Germany . |
| 3221852 | 1/1983 | Fed. Rep. of Germany . |
| 61-9900 | 1/1986 | Japan . |
| 0154395 | 6/1990 | Japan .................................. 307/353 |
| 1486294 | 11/1974 | United Kingdom . |

OTHER PUBLICATIONS

*A Multiple-Input Ota Circuit For Neural Networks*–80–90–IEEE Transactions On Circuits And Systems 36(1989) May, No. 5, New York, US; pp. 767–769 Russel D. Reed, and Randall L. Geiger.

Primary Examiner—Margaret R. Wambach

[57] ABSTRACT

A sample-and-hold circuit is provided with a plurality of first capacitors, respectively connected to a plurality of input signal lines through respective first analog switches, for sampling input signal voltages, a plurality of second capacitors, respectively connected to the plurality of first capacitors through respective second analog switches, for holding the sampled voltages, and a single operational amplifier for selectively receiving one of the voltages held in the plurality of second capacitors according to a control signal supplied thereto, and amplifying and outputting the received voltages.

8 Claims, 3 Drawing Sheets

SAMPLE-AND-HOLD CIRCUIT

BACKGROUND OF THE INVENTION

1. Field of the Invention

The present invention relates to a sample-and-hold circuit.

2. Description of the Related Art

A sample-and-hold circuit as shown in FIG. 3, which constitutes a part of an active matrix type liquid crystal driver circuit is known. Analog signals are input to the sample-and-hold circuit through signal lines V1 to Vn. The sample-and-hold circuit is provided with capacitors C1 to Cn and capacitors D1 to Dn for sampling and holding input voltages from the signal lines (the capacities of those capacitors include wire capacitances and stray capacitances). Ends on one side of the capacitors C1 to Cn are connected to the signal lines V1 to Vn through the analog switches S1 to Sn which are turned on and off by control signals SS1 to SSn, respectively, and the other ends of the capacitors C1 to Cn are all connected to ground. Ends on one side of the capacitors D1 to Dn are connected to the ends on one side of the capacitors C1 to Cn through analog switches H1 to Hn which are turned on and off by a control signal HS. The other ends of the capacitors D1 to Dn are connected to ground. Noninverting input terminals of operational amplifier circuits P1 to Pn are connected to the ends on one side of the capacitors D1 to Dn, respectively, while the inverting input terminals are connected to output terminals thereof, respectively. The output terminals of the operational amplifier circuits P1 to Pn are tied to a common line. Output control signals CN1 to CNn are input respectively to the operational amplifiers.

When high-level control signals SS1 to SSn are input respectively to the analog switches S1 to Sn, the analog switches turn on, for this input period, so that the capacitors C1 to Cn are connected to the signal lines V1 to Vn and charged. When the control signals SS1 to SSn go to the low level to turn off the switches S1 to Sn, the signal voltages just before that are held in the capacitors C1 to Cn, respectively. Then, when a high-level control signal HS is input, the switches H1 to Hn turn on for the input period, so that the capacitors D1 to Dn are respectively connected in parallel with the capacitors C1 to Cn and charged. After the control signal HS goes to the low level to turn off the switches H1 to Hn, the capacitors D1 to Dn hold voltages corresponding to the voltages heretofore held by the capacitors C1 to Cn, respectively.

When specified, output control signals CN1 to CNn are applied to the operational amplifier circuits P1 to Pn, respectively, their outputs are made active, and the voltages supplied to the noninverting input terminals are output, respectively. Therefore, by using control signals CN1 to CNn, it is possible to determine which of the voltages held by the capacitors D1 to Dn are output. For example, in case that a control signal CN1 is applied to the operational amplifier circuit P1, the output of the operational amplifier circuit P1 is made active, and the voltage held in the capacitor D1 is output as the output Vo. By changing over the control signals CN1 to CNn respectively, the voltages held in the capacitors D1 to Dn are output sequentially as the output Vo from the operational amplifier circuits P1 to Pn.

However, in such a sample-and-hold circuit, operational amplifier circuits are provided as buffer circuits on a one-to-one correspondence with the capacitors D1 to Dn. As a result, the number of devices constituting the sample-and-hold circuit is large. Accordingly a large chip area is required when this circuit is formed as an integrated circuit.

SUMMARY OF THE INVENTION

It is therefore an object of the present invention to provide a sample-and-hold circuit which precludes the a above-mentioned disadvantage and which are composed of a smaller number of devices constituting the device.

The object of the present invention can be achieved by a sample-and-hold circuit comprising a plurality of first capacitors, respectively connected to a plurality of input signal lines through respective first analog switches, for sampling input signal voltages, a plurality of second capacitors, respectively connected to the plurality of first capacitors through respective second analog switches, for holding the sampled voltages, and a single operational amplifier for selectively receiving one of the voltages held in the plurality of second capacitors according to a control signal supplied thereto, and amplifying and outputting the received voltage.

A plurality of input signals to be sampled are taken into a plurality of first capacitors, and then, held respectively in a plurality of second capacitors. The operational amplifier selects one of the voltages held in the plurality of the second capacitors, and amplifies and outputs it according to contents of a control signal supplied from the outside. Therefore, it is not necessary to provide a plurality of an operational amplifier according to each capacitor.

The operational amplifier may include a first input connected to an output thereof, a plurality of second inputs connected to ends of the second capacitors, respectively, a control signal input for a control signal supplied from the outside, and mechanism for selecting one of the second inputs as a noninverting input according to the control signal.

In a preferred embodiment the control signal input includes a plurality of binary signal inputs.

Further objects and advantages of the present invention will be apparent from the following description of the preferred embodiment of the invention as illustrated in the accompanying drawings.

DESCRIPTION OF THE EMBODIMENT

Figure 1:
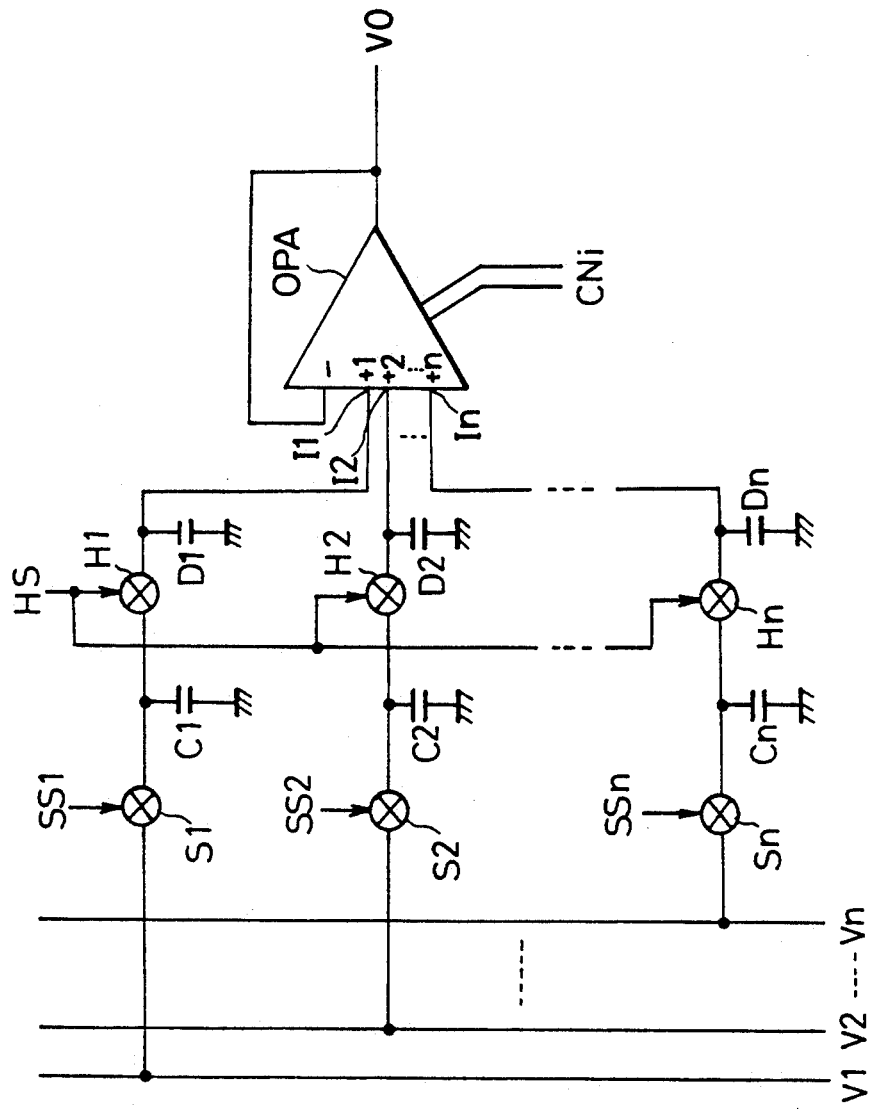
FIG. 1 is a circuit diagram of an embodiment of the sample-and-hold circuit according to the present invention.

Description will now be made of an embodiment of the present invention. FIG. 1 shows a sample-and-hold circuit according to the present invention, which constitutes a part of an active matrix type liquid crystal driver circuit. Analog signals are input to this sample-and-hold circuit through signal lines V1 to Vn. The sample-and-hold circuit is provided with capacitors C1 to Cn and capacitors D1 to Dn for sampling and holding signal voltages from the signal lines (the capacities of the capacitors include wire capacitances and stray capacitances). Ends on one side of the capacitors C1 to Cn are connected to the signal lines V1 to Vn through analog switches S1 to Sn which are turned on and off by control signals SS1 to SSn. The other ends of the capacitors C1 to Cn are all connected to ground. Ends on one side of the capacitors D1 to Dn are connected to the ends on one side of the capacitors C1 to Cn through analog switches H1 to Hn which are turned on and off by a control signal HS. The other ends of the capacitors D1 to Dn are connected to ground.

There is provided an operational amplifier circuit OPA having input terminals I1 to In for receiving the voltages held in the capacitors D1 to Dn. The operational amplifier circuit OPA selects one of the voltages supplied to the input terminals I1 to by means of a selection signal CNi, and uses the selected voltage as a noninverting input voltage. On the other hand, the inverting input terminal of the operational amplifier circuit OPA is connected to the output terminal thereof.

When high-level control signals SS1 to SSn are input respectively to the analog switches S1 to Sn, those switches turn on for this input period, and the capacitors C1 to Cn are connected to the signal lines V1 to Vn and charged, respectively. When the control signals SS1 to SSn go to the low level and the switches S1 to Sn turn off, the signal voltages of the signal lines V1 to Vn just before that are held in the capacitors C1 to Cn, respectively. Then, when a high-level control signal HS is input, the switches H1 to Hn turn on all at once, so that the capacitors C1 to Cn are respectively connected in parallel with the capacitors C1 to Cn and charged. After the control signal HS goes to the low level and the switches H1 to Hn turn off, the capacitors D1 to Dn hold the voltages corresponding to the voltages held in the capacitors C1 to Cn, respectively.

After this, when a selection signal CNi composed of parallel and multiple binary signals is applied, the operational amplifier circuit OPA selects one of the voltages supplied to the input terminals I1 to In according to the contents of the signal, and uses this selected voltage as the noninverting input. Therefore, for example, in the event that a selection signal CNi is applied which specifies that the voltage of the input terminal I1 be selected, the operational amplifier circuit OPA gets the voltage held in the capacitor D1 as a noninverting voltage, and sends it out as the output Vo. By varying the contents of the control signal CNi, the operational amplifier circuit OPA is made to sequentially output the voltages held in the capacitors D1 to Dn as the output Vo.

Figure 2:
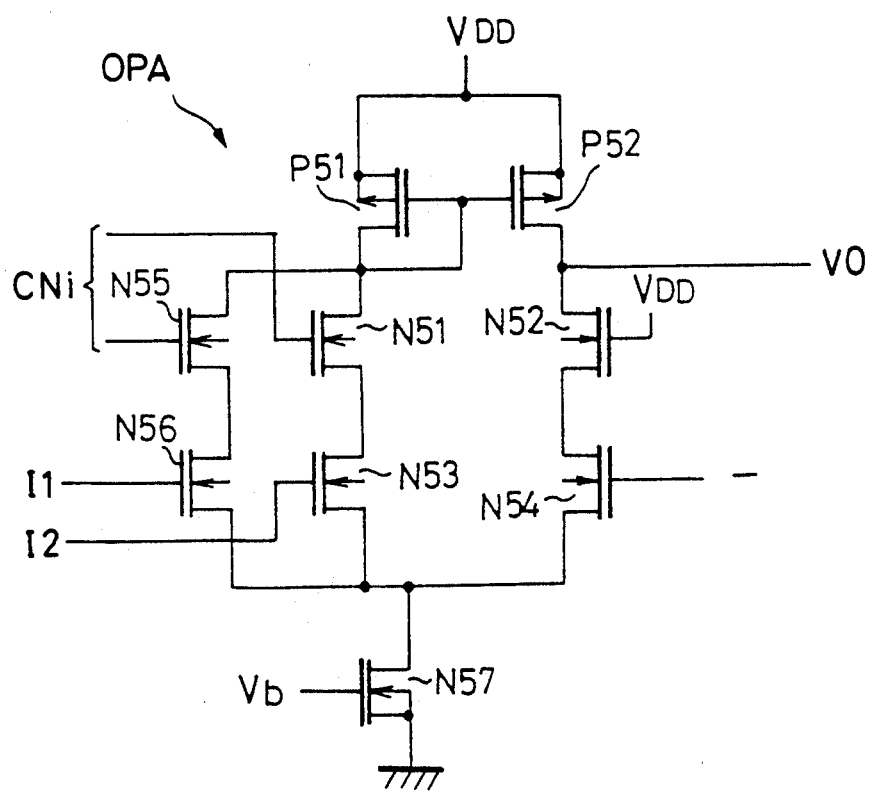
FIG. 2 is a circuit diagram of an example of the operational amplifier used in the sample-hold circuit.
Figure 3:
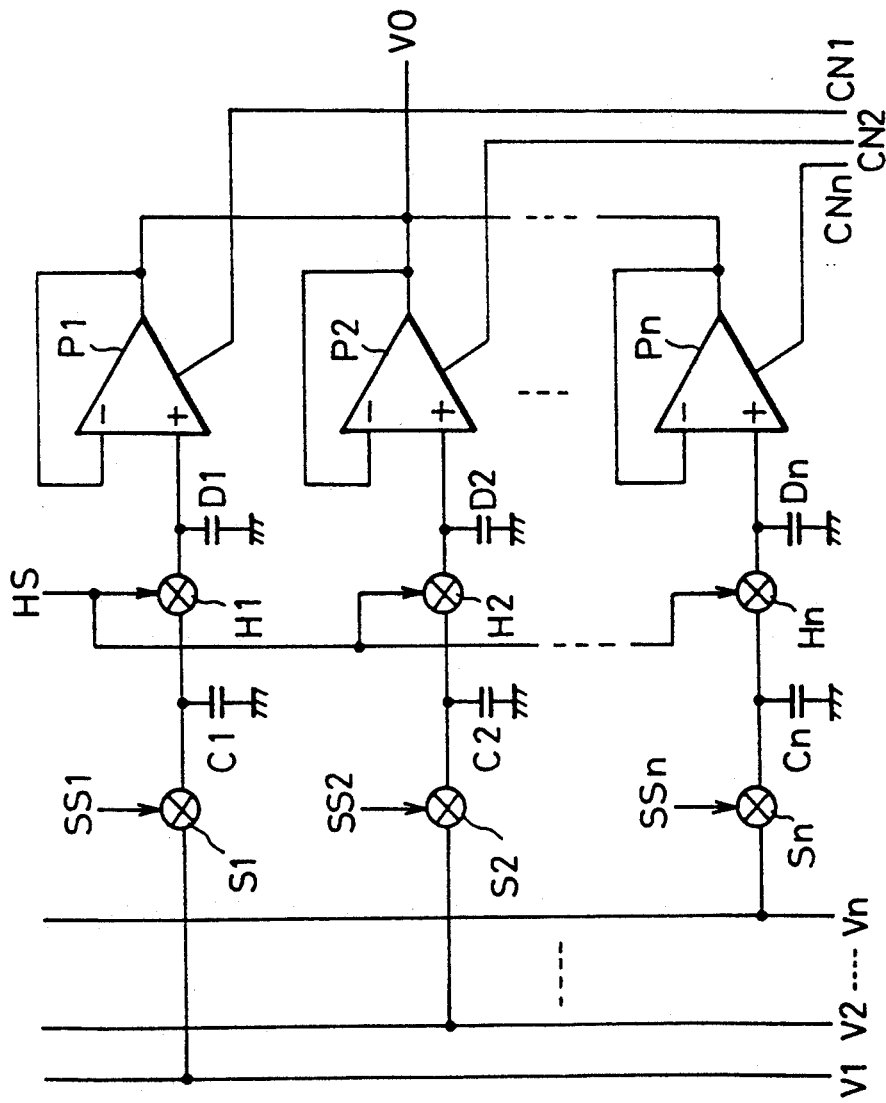
FIG. 3 is a circuit diagram of an example of a sample-and-hold circuit.

The operational amplifier OPA is basically a differential amplifier and has the arrangement shown in FIG. 2. The operational amplifier OPA according to the example in FIG. 2 is provided with two noninverting terminals I1 and I2. Therefore, the voltages held in the capacitors connected to the noninverting terminals, respectinely, are output sequentially as the output Vo from the amplifier.

One terminal of an n-channel MOS transistor N57 is connected to the ground, and a potential Vb is applied to the gate of the transistor N57. Each one terminal of p-channel MOS transistors P51, P52 is connected to a power supply VDD and each gate of the transistors P51, P52 is connected to the other terminal of the transistor P51.

Each one terminal of n-channel MOS transistors N56, N53 is connected to the other terminal of the transistor N57. The other terminals of the transistors N56, N53 are connected to the other terminal of the transistor P51 through the MOS transistors N55, N51, respectively.

The gates of the transistors N56, N53 are connected to the non-inverting input terminals I1 and I2 of the operational amplifier OPA, respectively. Control signals CNi are applied to the gates of the transistors N55 and N51 respectively. An n-channel MOS transistor N54 whose gate is connected to the inverting input terminal is connected between the other terminal of the transistor P52 through the n-channel MOS transistor N52 and the other terminal of the transistor N57. A contact of the transistors N52 and P52 is connected to the output terminal Vo of the operational amplifier OPA. The gate of the transistor N52 is connected to the power supply VDD.

As has been described, in the sample-and-hold circuit according to the present invention, the operational amplifier circuit selectively receives one of the voltages held in a plurality of capacitors according to the contents of the control circuit supplied from outside, and amplifies and outputs the received voltage. Therefore, it is not necessary to provide a plurality of an operational amplifier circuit according to each capacitor. As a result, the number of devices constituting the circuit can be decreased and the chip area required for forming the circuit as an integrated circuit can be reduced.

Many widely different embodiments of the present invention may be constructed without departing from the spirit and scope of the present invention. It should be understood that the present invention is not limited to the specific embodiments described in the specification, except as defined in the appended claims.

What is claimed is:

1. A sample-and-hold circuit comprising:
a plurality of first capacitors, respectively connected to a plurality of input signal lines through respective first analog switches, for sampling input signal voltages;
a plurality of second capacitors, respectively connected to said plurality of first capacitors through respective second analog switches, for holding the sampled voltages; and
a single operational amplifier having a plurality of inputs respectively connected to ends of said second capacitors, a control signal input receiving a control signal supplied thereto, and selectively connecting means for selectively connecting said amplifier with one of said plurality of inputs in response to said control signal such that said amplifier receives one of the voltages held in said plurality of second capacitors, said amplifier amplifying and outputting the received voltage at an output thereof.

2. A sample-and-hold circuit according to claim 1, wherein said plurality of inputs of said amplifier corresponds to a non-inverting input and said operational amplifier further includes another input as an inverting input connected to said output thereof.

3. A sample-and-hold circuit according to claim 2, wherein said control signal input includes a plurality of binary signal inputs.

4. A sample-and-hold circuit according to claim 1, wherein said control signal input includes a plurality of binary signal inputs.

5. A sample-and-hold circuit comprising:
a plurality of first capacitors, respectively connected to a plurality of input signal lines through respective first analog switches, for sampling input signal voltages;

a plurality of second capacitors, respectively connected to said plurality of first capacitors through respective second analog switches, for holding the sampled voltages; and a single operational amplifier having an output, a first input connected to said output, a plurality of second inputs respectively connected to ends of said second capacitors, a control signal input receiving a control signal supplied thereto, and selectively connecting means for selectively connecting said amplifier with one of said plurality of second inputs in response to said control signal such that said amplifier receives one of the voltages held in said plurality of second capacitors, said amplifier amplifying and outputting the received voltage at said output.

6. A sample-and-hold circuit according to claim 5, wherein said control signal input includes a plurality of binary signal inputs.

7. A sample-and-hold circuit comprising:

a plurality of first capacitors, respectively connected to a plurality of input signal lines through respective first analog switches, for sampling input signal voltages;

a plurality of second capacitors, respectively connected to said plurality of first capacitors through respective second analog switches, for holding the sampled voltages; and a single operational amplifier having an output, a first input connected to said output, a plurality of second inputs respectively connected to ends of said second capacitors, a plurality of binary control signal inputs each receiving a binary control signal supplied thereto, and selectively connecting means for selectively connecting said amplifier with one of said plurality of second inputs in response to a binary control signal such that said amplifier receives one of the voltages held in said plurality of second capacitors, said amplifier amplifying and outputting the received voltage at said output.

8. The sample-and-hold circuit according to claim 7, wherein said selectively connecting means include a plurality of first MOS transistors whose gates are respectively connected to said plurality of second inputs and a plurality of second MOS transistors whose gates are respectively connected to said plurality of binary control signal inputs, each of said first MOS transistors being connected in series to a corresponding second MOS transistor.

* * * * *